(12) United States Patent
Goodno

(10) Patent No.: US 7,884,997 B2
(45) Date of Patent: Feb. 8, 2011

(54) SYSTEM AND METHOD FOR COHERENT BEAM COMBINATION

(75) Inventor: Gregory Douglas Goodno, Los Angeles, CA (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 521 days.

(21) Appl. No.: 11/945,931

(22) Filed: Nov. 27, 2007

(65) Prior Publication Data

US 2009/0134310 A1    May 28, 2009

(51) Int. Cl.
  *H01S 3/00*    (2006.01)
  *H04B 10/17*    (2006.01)
(52) U.S. Cl. .................. 359/349; 356/477; 356/484
(58) Field of Classification Search .................. 359/349; 356/477, 484; 372/29.011, 29.016, 29.023
  See application file for complete search history.

(56) References Cited

U.S. PATENT DOCUMENTS

| 4,295,741 | A |  | 10/1981 | Palma et al. |
|---|---|---|---|---|
| 4,755,016 | A |  | 7/1988 | DeLoach, Jr. et al. |
| 6,219,360 | B1 |  | 4/2001 | Komine |
| 6,229,616 | B1 |  | 5/2001 | Brosnan et al. |
| 6,366,356 | B1 | * | 4/2002 | Brosnan et al. ............. 356/477 |
| 6,404,784 | B2 |  | 6/2002 | Komine |
| 6,666,590 | B2 |  | 12/2003 | Brosnan |
| 6,708,003 | B1 |  | 3/2004 | Wickham et al. |
| 6,813,069 | B2 | * | 11/2004 | Rice et al. ................... 359/349 |
| 6,972,887 | B2 | * | 12/2005 | Wickham et al. ........... 359/237 |
| 7,088,743 | B2 |  | 8/2006 | Rice et al. |

OTHER PUBLICATIONS

Goodno, et al.: "*Brightness-Scaling Potential of Actively Phase-Locked Solid-State Laser Arrays*"; IEEE Journal of Selected Topics in Quantum Electronics, vol. 13, No. 3, May/Jun. 2007; p. 460-472.

* cited by examiner

*Primary Examiner*—Eric Bolda
(74) *Attorney, Agent, or Firm*—Tarolli, Sundheim, Covell & Tummino LLP

(57) ABSTRACT

Systems and methods for coherent beam combination of lasers are provided. In one embodiment, a method for coherent beam combination is provided. The method comprises providing a plurality of secondary laser signals from a primary laser signal, amplifying the plurality of secondary signals along respective amplifier arms to provide a plurality of amplified output signals, providing a frequency-shifted reference beam from the primary laser signal, generating a plurality of optically heterodyne detected (OHD) beat signals based on combining respective amplified output signals of the plurality of amplified output signals with the frequency-shifted reference beam, and adjusting path lengths of respective amplifier arms based on respective amplitudes of the plurality of OHD beat signals to control the path length of respective amplifier arms to within a coherence length of the primary laser signal.

20 Claims, 5 Drawing Sheets

SYSTEM AND METHOD FOR COHERENT BEAM COMBINATION

TECHNICAL FIELD

The present invention relates generally to optics, and more particularly to a system and method for coherent beam combination.

BACKGROUND

Coherent beam combination (CBC) of laser amplifiers is a well-established technique for locking multiple laser emitters in phase with one another to form a high brightness beam. Typically, the output from a low-power master oscillator (MO) is split into a multiplicity of beams, each of which is passed through a laser amplifier to increase its power. The amplified output beams are combined geometrically and phase-locked to a reference beam that is also derived from the MO. The combined beam behaves as if it were emitted from a single aperture laser, but with higher brightness than can be obtained from an individual laser. CBC imposes a requirement that the optical path length through each laser amplifier in the phase-locked array must be matched to within a small fraction of the MO coherence length. If the optical path mismatch between any two elements exceeds the coherence length, then the two elements will appear to be incoherent with one another, and they cannot be successfully phase-locked. Even if the optical path mismatch is only a fraction of the coherence length, the coherence between the two lasers will be less than 100%, leading to a reduction in the array brightness.

Due to the long path lengths involved with either free-space or fiber amplifiers (typically >10 m), it is difficult to match paths to within less than a few cm. Different amounts of thermal expansion or strain in each amplifier can cause the path mismatches to vary dynamically with the laser environment or thermal loads. This typically leads to a requirement that the MO coherence length be much greater than the anticipated path mismatches. The coherence length scales inversely with the laser bandwidth according to $$L_{coh} = c\tau_{coh} \approx c/\Delta f, \quad (1)$$

where c is the speed of light, and $\Delta f$ is the laser bandwidth. Thus a practical path-matching tolerance of ~10 cm leads to a requirement that the laser bandwidth be several GHz or less.

In practice, the constraint is more restrictive than this to avoid any noticeable reduction in the coherence between individual emitters. For the case of fiber laser amplifiers, the use of narrow-band radiation from the MO imposes limits on the capacity to generate high power. Stimulated Brillouin Scattering (SBS) is a nonlinear effect in which the laser electric field creates a phase grating in the fiber core via electrostriction that reflects some fraction of the forward-propagating beam. If the effective reflectivity of this grating becomes too large, the output power from the fiber will decrease, with the lost power being reflected backwards towards the MO. SBS limits the powers available from narrow-bandwidth fiber lasers. SBS can also pose a damage risk to hardware if the reflected power feeds back into the MO and/or pre-amplifier. One approach to CBC requires a means to reduce SBS. Typically, this involves a controlled broadening of the MO spectrum, either via a rapidly varying chirp applied to the MO frequency or via static phase modulation. In either case, practical considerations of the path-matching stability between amplifier legs limits the amount of frequency broadening to several GHz.

SUMMARY

In an aspect of the invention, a laser system is provided. The laser system comprises a master oscillator for generating a primary laser signal, a beam splitter array for splitting the primary laser signal into a sample reference signal and a plurality of secondary laser signals, an optical frequency shifter for shifting the frequency of the sample reference laser signal to provide a frequency-shifted reference beam and a beam expander for expanding the frequency-shifted reference beam to provide an expanded frequency-shifted reference beam. The laser system further comprises a plurality of amplifier arms that each receive a respective secondary laser signal of the plurality of secondary laser signals, where each amplifier arm comprises a path length adjuster for adjusting a path length of the amplifier arm and an amplifier for amplifying the secondary laser signal to provide an amplified output signal. The laser system also comprises a beam sampler that interferes the light of the amplified output signal of the plurality of amplifier arms with the expanded frequency-shifted reference beam to provide a plurality of optical beat signals, a plurality of photodetectors that each receive a respective optical beat signal to provide a plurality of optical heterodyne detected (OHD) beat signals, each OHD beat signal having a maximum amplitude that corresponds to a minimum path length mismatch of a respective amplifier arm and a path length controller responsive to the plurality of OHD beat signals for providing a plurality of feedback signals to adjust the path length adjusters to control the path length of each of the plurality of amplifier arms to within a coherence length of the primary laser signal.

In another aspect of the invention, a laser system is provided. The laser system comprises means for providing a plurality of secondary laser signals from a primary laser signal, a plurality of means for amplifying the plurality of secondary laser signals to provide a plurality of amplified output signals, means for providing a frequency-shifted reference beam from the primary laser signal, means for generating a plurality of optical heterodyne detected (OHD) beat signals from the mixing of the plurality of amplified output signals and the frequency-shifted reference beam, a plurality of means for adjusting a path length associated with respective means for amplifying for each of the plurality of means for amplifying, and means for controlling the plurality of means for adjusting a path length based on respective amplitudes of the plurality of OHD beat signals to control the path length of each of the plurality of means for amplifying to within a coherence length of the primary laser signal.

In yet another aspect of the invention, a method for coherent beam combination is provided. The method comprises providing a plurality of secondary laser signals from a primary laser signal, amplifying the plurality of secondary signals along respective amplifier arms to provide a plurality of amplified output signals, providing a frequency-shifted reference beam from the primary laser signal, generating a plurality of optically heterodyne detected (OHD) beat signals based on combining respective amplified output signals of the plurality of amplified output signals with the frequency-shifted reference beam, and adjusting path lengths of respective amplifier arms based on respective amplitudes of the plurality of OHD beat signals to control the path length of respective amplifier arms to within a coherence length of the primary laser signal.

DETAILED DESCRIPTION

Figure 1:
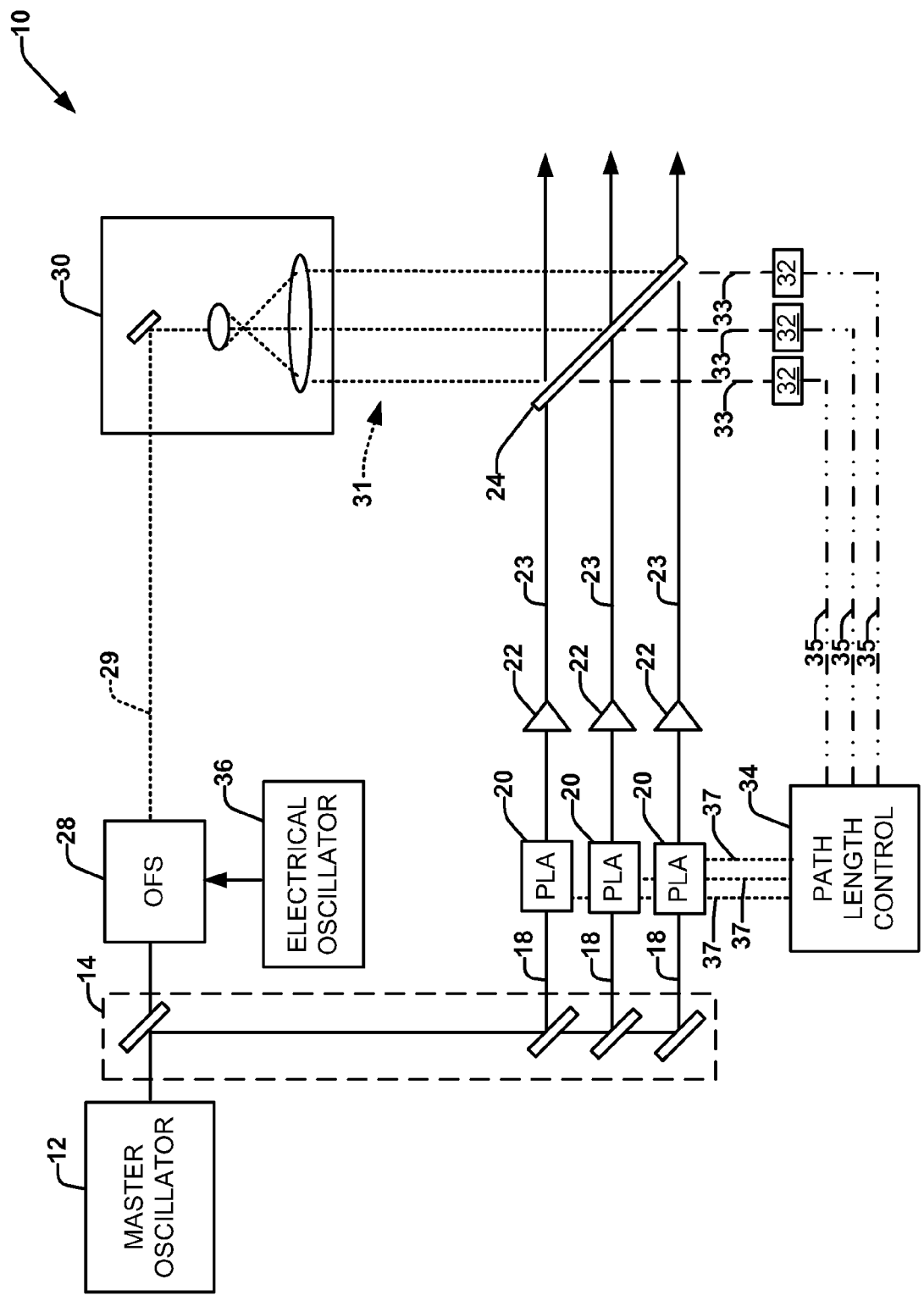
FIG. 1 illustrates a schematic block diagram of a laser system in accordance with an aspect of the present invention.

Systems and methods for coherent beam combination (CBC) of broadbandwidth lasers are provided. In the systems and methods, an output from a master oscillator (MO) is split into a plurality of beams, each of which is passed through respective laser amplifier arms (e.g., fiber lasers, free-space bulk lasers) to increase the power of each of the plurality of beams. The amplified plurality of beams may be combined into a single output beam to provide a high average power output beam. The combined beam behaves as if it were emitted from a single aperture laser, but with higher brightness than can be obtained from an individual laser. It is to be appreciated that the path lengths of the laser amplifier arms can vary due to manufacturing tolerances, operating temperature and a variety of other factors.

The systems and methods provide for a feedback loop that controls path length mismatch. In one aspect of the invention, the systems and methods provide for feedback loops to control both signal phase matching and path length matching and a means to sense the phase difference and path length difference between the amplified signal beams and a reference beam. The feedback loops can include a phase modulator in each amplifier arm path to control phase differences between the respective amplifier arm and the reference beam to within a small fraction of an optical wavelength and a path length adjuster (e.g., an actuator, such as a switchable array of spiral waveguides) in each amplifier arm path to control the path length differences to match path lengths to less than a coherence length.

In one aspect of the invention, a sample of the amplified signal from each amplifier is combined with a frequency-shifted reference signal to produce a plurality of optical beat signals. The optical beat signals are provided to respective photodetectors to produce a plurality of optically heterodyne detected (OHD) beat signals. The phase of a respective OHD beat signal corresponds to the phase difference between the respective amplified signal and the reference signal. Thus, the OHD beat signal phase can provide feedback to a phase adjuster (e.g., electro-optic modulator (EOM)) in the signal path to control the phase offset to within an arbitrary multiple of one wavelength, thus ensuring the amplified signal and frequency-shifted reference signal are phase-locked. The OHD beat signal also contains information about the relative path lengths via its amplitude, such that the highest amplitude of the OHD beat signal corresponds to the minimal path mismatch between the amplifier and reference beam. This OHD beat signal amplitude is equivalent to the fringe visibility between the reference and signal and is simply the time-domain equivalent of a spatial interference pattern between two partially coherent plane waves. If the path difference between the reference and signal exceeds or is a sizeable fraction of the coherence length, the fringe visibility will be reduced. If the path lengths are matched, the fringe visibility will be maximized. Therefore, the amplitude provides a metric of the path length matching between signal and the reference beam. The signal amplitude can provide an error signal for a second feedback loop to drive an actuator to control this path difference. The first and second feedback loops can provide a fine and a coarse path length control, respectively.

FIG. 1 illustrates a laser system 10 in accordance with an aspect of the present invention. The laser system 10 includes a master oscillator (MO) 12 that may be a conventional laser, such as a gas laser, diode laser or a solid state laser. The MO 12 provides a primary laser signal that is directed to a beam splitter array 14. The beam splitter array 14 consists of a plurality of beam splitters which may be either free-space or fiber. The beam splitter array 14 divides the primary laser signal from the MO 12 into a plurality of secondary laser signals and a sample reference signal and directs the plurality of secondary laser signals into a plurality of laser amplifier arms 18 and the sample reference signal into an optical frequency shifter (OFS) 28.

Each of the plurality of amplifier arms 18 includes a path length adjuster (PLA) 20 and an amplifier 22. The PLA 20 receives distributed light from the beam splitter array 14 and provides an adjustable delay path to a respective amplifier 22. The outputs of each of the amplifiers 22 provide an amplified output beam 23 to a beam combiner (not shown) that combines the beams output from the plurality of fiber amplifiers 22 to provide a high average power output light beam. The beam combiner can be, for example, a plurality of close-packed lenses or mirrors that collimate and tile the plurality of amplified light beams into a single composite high power output beam. Each PLA 20 is configured to adjust the path length of its respective amplifier arm 18 based on a comparison of a respective amplified output beam to a reference beam by a path length controller 34. The path length controller 34 is configured to continuously adjust the path lengths of each of the PLAs 20 to maintain the path lengths of the fiber amplifier arms 18 to within a small fraction of the coherence length of the primary laser signal of the MO 12.

The path length controller 34 employs respective OHD beat signals 35 as feedback for each amplifier arm 18 to determine path length adjustments to each PLA 20 and to generate respective feedback signals 37. The OHD beat signals 35 are generated by combining a sample of each amplified output signal 23 with an expanded frequency-shifted reference signal 31 to generate an array of optical beat signals 33. Each optical beat signal 33 is provided to a respective photodetector 32 to generate OHD beat signals associated with respective optical beat signals 33. It is known to employ such an OHD beat signal to determine the phase difference between the respective amplified output signal and a frequency-shifted reference signal to adjust the phase of each amplified signal within an integer multiple of one wave to ensure the phase of the output signal and frequency-shifted reference signal are phased locked. This is known as the modulo-$2\pi$ approach to phase matching of a plurality of amplified output beams derived from an MO and provided over respective amplifier arms to be combined into a single output beam. The techniques and structures associated with the modulo-$2\pi$ approach are taught in commonly owned U.S.

Pat. No. 6,366,356, entitled "High Average Power Fiber Laser System with High-Speed, Parallel Wavefront Sensor", U.S. Pat. No. 6,219,360, entitled "High Average Power Solid-State Laser System with Phase Front Control" and U.S. Pat. No. 6,229,616, entitled "Heterodyne Wavefront Sensor", the entire contents of each being incorporated by reference herein.

The following will provide a basic description for providing the OHD beat signals 35. Some structural and functional details have been omitted from the following description for the sake of simplicity, but can be found in the above cited U.S. Pat. Nos. 6,366,356, 6,219,360 and 6,229,616, which have been incorporated herein. An electrical oscillator 36 generates a fixed frequency electrical signal which is applied through an amplifier or driver (not shown) to an optical frequency shifter (OFS) 28. The OFS 28 can be, for example, an acousto-optic modulator (AOM) or an electro optic modulator (EOM). The fixed frequency electrical signal may be a sinusoidal signal at 40 MHz, but any fixed frequency (e.g., about 10 KHz to about 100 MHz) may be employed. The OFS 28 serves to shift the optical frequency of the sample reference signal by an amount of frequency corresponding to the fixed frequency electrical signal to provide a frequency-shifted reference beam 29.

The frequency-shifted reference beam 29 is provided to a beam expander 30, for example, via a passive reference optical fiber (not shown) to provide an expanded frequency-shifted reference beams 31. The beam sampler 24, that is mostly transparent to the amplified output beams 23, interferes the light from the expanded frequency-shifted reference beam 31 and an array of samples of amplified output beams 23. The optical interference between the beams generates respective optical beat signals 33 at the beat frequency representative of the modulation frequency from the electrical oscillator 36. Each optical beat signal 33 is focused onto a respective photo detector 32 by optics (not shown). Each photodetector 32 responds to the intensity variations of the optical beat signal 33, thereby generating the OHD beat signals 35 for each respective amplifier arm 18. The OHD beat signals 35 from each photodetector 32 are provided to the path length controller 34. The amplitude (or power) of each of the OHD beat signals 35 contains the path length information of the corresponding amplifier arms 18. The path length controller 34 provides closed-loop path length corrections for each amplifier arm 18 utilizing the amplitude of the respective OHD beat signals 35 to evaluate an error signal and to generate feedback signals 37.

Figure 2:
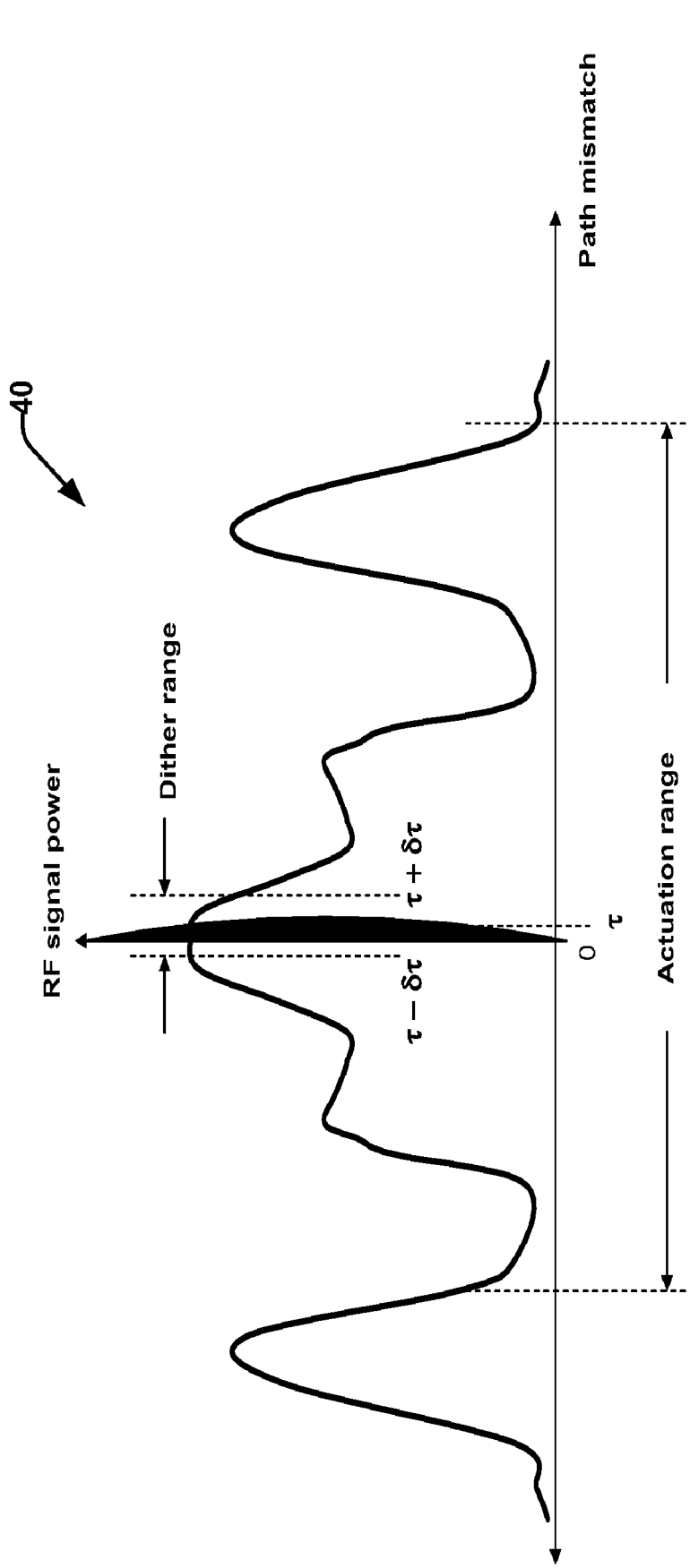
FIG. 2 illustrates a conceptual graph of an optically heterodyne detected (OHD) beat signal waveform in accordance with an aspect of the present invention.

FIG. 2 illustrates a conceptual graph of the amplitude of an OHD beat signal waveform 40 as a function of path length mismatch (or, equivalently, time delay) between a respective amplifier output signal and a reference signal. The illustrated waveform 40 of FIG. 2 is representative of the general case of a broadband MO signal with a complex spectrum, where there may exist multiple local minima in the amplitude. If these local minima do not exist, then the control problem is simplified. For any practical laser system, the path mismatch between signal and reference can be assumed to be constrained to within some initial tolerance level based on the system design, corresponding to the actuation range of the PLA 20 required on the active path length control. Upon turning on the path length controller 34, the OHD beat signal amplitude of each amplifier arm 18 can assume any value within this initial range of path mismatches as shown in FIG. 2.

The object of the path length control 34 is to identify the zero path mismatch location based on measurement of the beat signal amplitude, which is the position that provides the maximum signal power. The path length control 34 can scan the actuation range of the respective PLA 20 and measure the beat signal amplitude to determine a maximum amplitude location. The path length control 34 can then select an initial dither range about the maximum amplitude location. The initial dither range can be continuously adjusted based on changes of the maximum amplitude location. The path length control 34 can repeat this process for each amplifier arm 18. Upon the completion of the first scan and initial dither range selection, the path length control 34 can continuously update the dither ranges of each fiber amplifier arm 18 without repeating the full path length scan.

Figure 3:
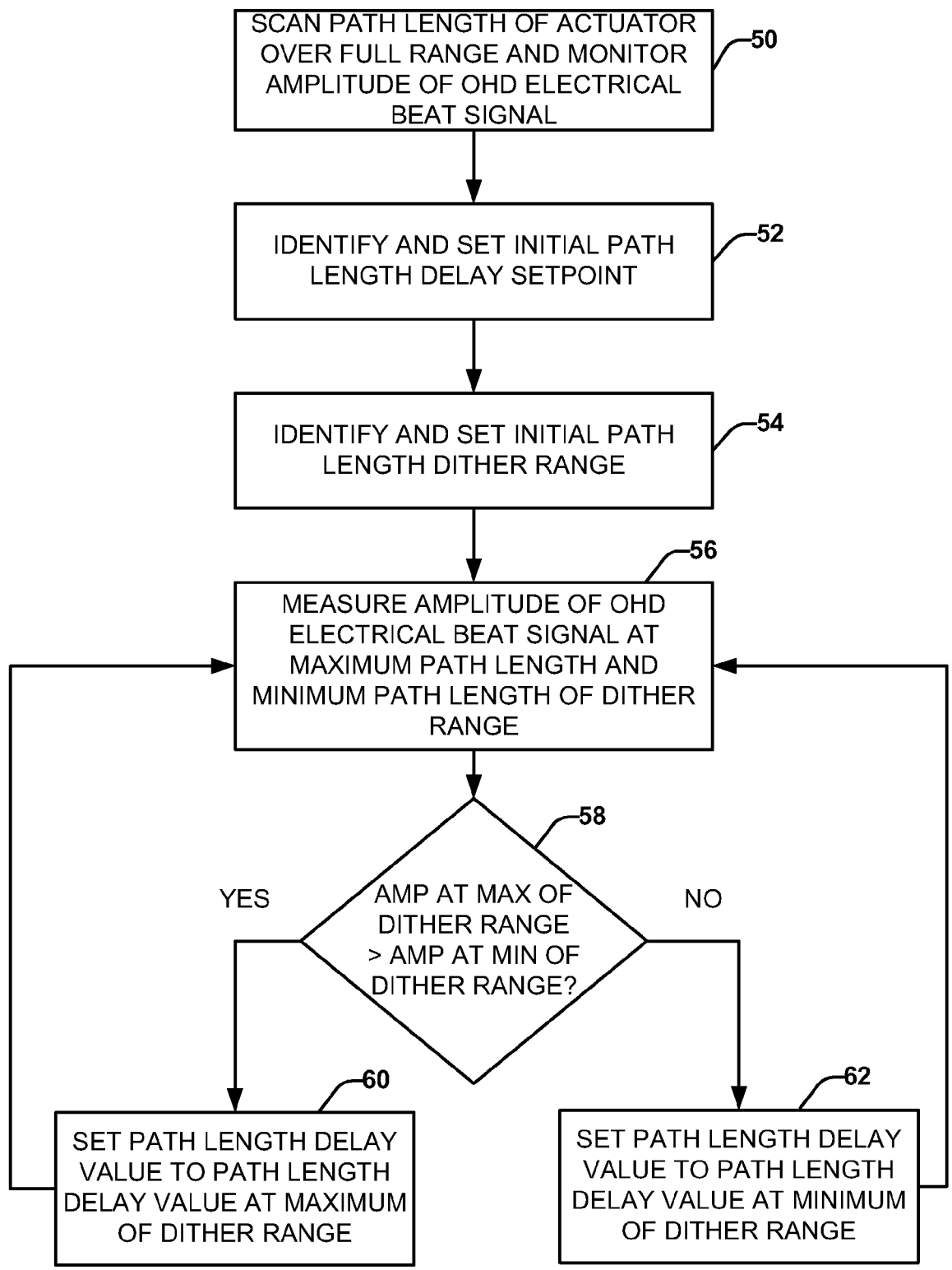
FIG. 3 illustrates a methodology for path length control for a given amplifier arm in accordance with an aspect of the present invention.

FIG. 3 illustrates a methodology for path length control for a given amplifier arm in accordance with an aspect of the present invention. At 50, the signal amplitude of the OHD beat signal is monitored while scanning the full range of a respective PLA. At 52, an initial value of a path length delay setpoint τ is selected that corresponds to the maximum amplitude measured of the OHD beat signal and thus is the closest to the zero path mismatch value. However, due to dynamic path fluctuations and noise, the setpoint value τ may not be equal to the zero path mismatch position, but if the actuation speed is sufficiently fast then it will be sufficiently close to ensure that the nearest local maximum of the OHD beat signal amplitude also corresponds to the global maximum.

At 54, an initial path length dither range is selected to periodically dither the path mismatch over a small range δτ about τ while monitoring the change in the signal amplitude, where δτ is a constant. The dither range δτ is chosen based on a trade off between the desire to avoid significant reductions in the mutual coherence between signal and reference (which prompts one to select a small value of δτ), and the need to acquire a clear error signal to signify the optimal path length setting (which would prompt one to select a large value of δτ). In practice, selecting δτ to provide ~1% changes in the OHD beat signal amplitude would be likely to provide usable error signals with minimal reduction in coherence. For a low-noise laser system, δτ values that provide <1% modulation of the RF beat signal amplitude may be feasible. The methodology then proceeds to 56. At 56, the beat signal amplitude is measured at a maximum path length τ+δτ of the dither range and a minimum path length τ−δτ of the dither range.

At 58, the methodology determines if the amplitude at the maximum path length of the dither range is greater than the amplitude at the minimum path length of the dither range. If the amplitude at the maximum path length of the dither range is greater than the amplitude at the minimum path length of the dither range (YES), the path delay value setpoint is set to the path length delay value at the maximum path length (τ+δτ) of the dither range. If the amplitude at the maximum path length of the dither range is not greater than the amplitude at the minimum path length of the dither range (NO), the path delay value setpoint is set to the path length delay value at the minimum path length (τ+δτ) of the dither range. The methodology then returns to 56 to continuously repeat the dithering until the setpoint value is within ±δτ of the zero path mismatch condition. The setpoint will continuously fluctuate within this range under steady state, but since δτ does not impose more than a small reduction in mutual coherence, the impact of this small path mismatch on the system performance will be minimal.

Figure 4:
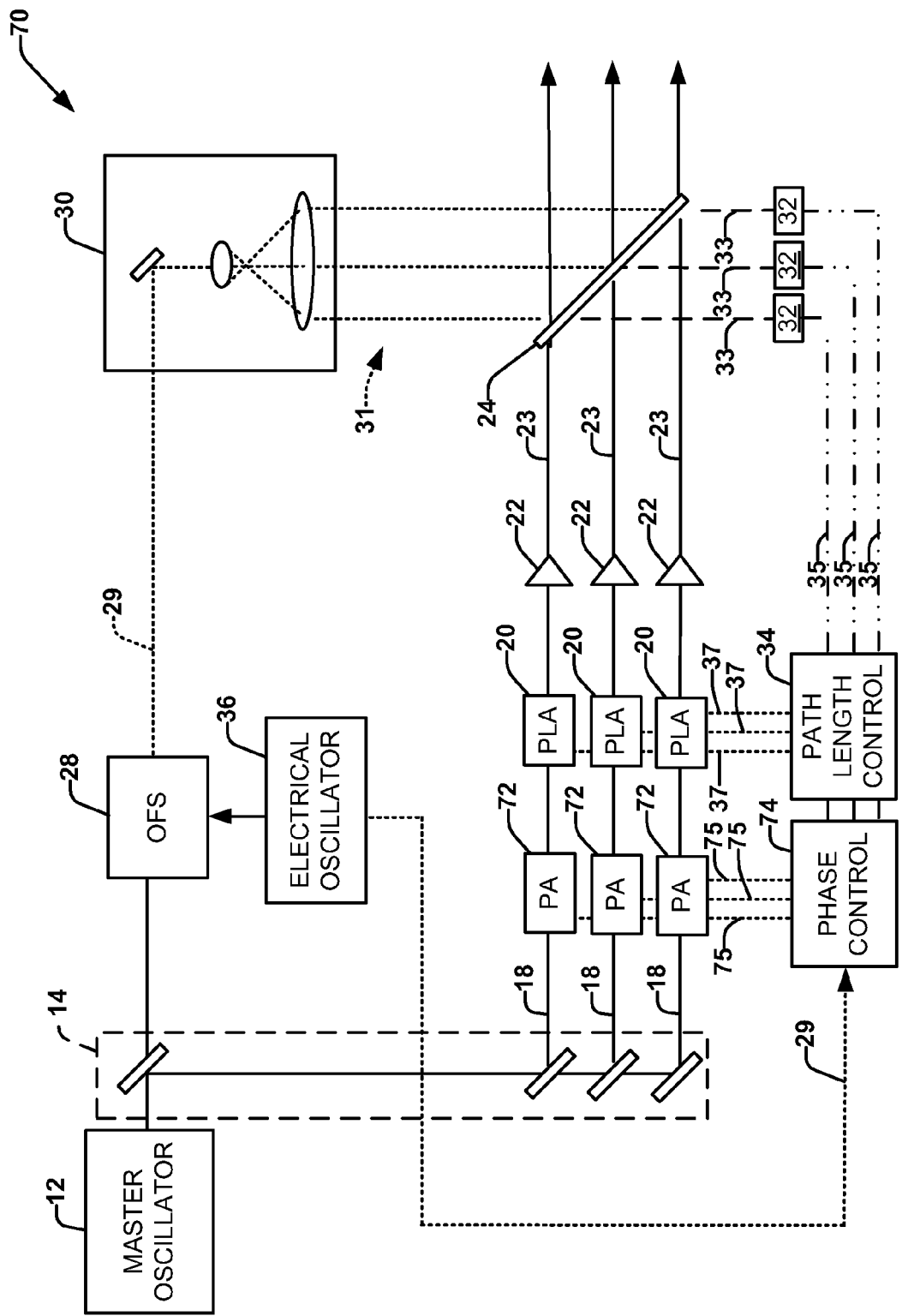
FIG. 4 illustrates a schematic block diagram of a laser system in accordance with another aspect of the present invention.

FIG. 4 illustrates a laser system 70 in accordance with another aspect of the present invention. The laser system 70 of FIG. 4 incorporates phase control based on a modulo-2π approach into the laser system 10 of FIG. 1. Therefore, like reference numerals have been employed to denote like parts. The laser system 70 of FIG. 4 includes phase adjuster (PA) 72

(e.g., EOM, AOM) disposed in each of the amplifier arms 18 and located before the amplifier 22. Each respective PA 72 can either be located before or after a respective PLA 20. The laser system 70 also includes a phase controller 74 that compares the phase of the OHD beat signal 35 for each respective amplifier arm 18 with fixed frequency electrical signal to determine a phase error offset of the respective amplified output signal 23. The phase controller 74 employs the phase offset information to provide feedback signals 75 to each respective phase adjuster 74 in the signal paths 18 to control the phase difference to within an arbitrary multiple of one wavelength, thus ensuring the amplified signal 23 and reference signal 31 are phase-locked. As previously described, the path length controller 34 employs the amplitude of the OHD beat signal 35 to maintain each path length of the amplifier arm 18 to within a coherence length, such the path length controller 34 and respective second feedback loop provides for a coarse path length adjustment and the phase controller 74 and respective first feedback loop provide for fine path length adjustment. It is to be appreciated that the phase adjuster 74 and the path length control could be integrated into a single unit, as for example, separate or integrated algorithms.

The following is a mathematical description of the signal generation, detection, and processing to generate a feedback signal to control optical path length differences between the "signal" and "reference" paths. The description specifically highlights the impact of a broadband laser on coherence as a function of path mismatch. The description begins with an analysis of the simplified case of phase-locking using single-frequency lasers. Referring to FIG. 4, the master oscillator 12 is assumed to be an idealized single-frequency laser that emits a time-dependent laser field of the form $$E_{MO}(t) = E_{MO} \exp(i\omega t), \qquad (EQ.\ 1)$$

where $E_{MO}$ is a constant (or nearly constant) field amplitude and $\omega$ is the optical carrier frequency. The MO beam is split into N+1 beamlets using the beamsplitter array 14. Each of the N signal beamlets are amplified to high power and then tiled with its neighbors in a close-packed arrangement to form a composite output beam. The laser field of each signal beam after amplification is $$E_{sig}(t,\tau) = E_{sig} \exp[i\omega(t-\tau) + i\phi(t)], \qquad (EQ.\ 2)$$

where $E_{sig}$ is a constant (or nearly constant) field amplitude; $\tau$ represents the relative delay in optical transit times (i.e., the path mismatch) between the reference and signal paths; and $\phi(t)$ is a time-dependent phase shift corresponding to time-dependent changes in the optical path length of the signal beam. While the above is an expression for only one signal beam, it is to be understood that each of the N signal beams can be represented with a similar expression to Eq (2), where $\phi(t)$ is not necessarily identical for each signal beam.

The $(N+1)^{th}$ beamlet 14 is frequency-shifted by a frequency $\Delta\omega$ upon passage though an acousto-optic or electro-optic modulator 28 so that its field after being frequency-shifted is $$E_{ref}(t) = E_{ref} \exp[i(\omega + \Delta\omega)t], \qquad (EQ.\ 3)$$

where $E_{ref}$ is a constant (or nearly constant) field amplitude, and $\omega + \Delta\omega$ is the frequency of the frequency-shifted reference beam. The frequency-shifted reference beam 29 is then expanded with the beam expander 30 and interferometrically combined with a low-power sample of the composite output beam using the beam sampler 24. The array of square law photodetectors 32 are positioned in the footprint of the sampled composite beam so that each detects light from a single amplified output beam 23 as well as light from the frequency-shifted expanded reference beam 31. The total optical field of the light incident on a photodetector is the linear sum of the signal and reference fields $$E_{sig}(t,\tau) + E_{ref}(t) = E_{sig} \exp[i\omega(t-\tau) - i\phi(t)] + E_{ref} \exp[i(\omega + \Delta\omega)t]. \qquad (EQ.\ 4)$$

The photodetector can only detect photons and thus produces a photocurrent or voltage that is proportional to the modulus-square of the incident optical field:

$$\begin{aligned}
V(t,\tau) &= |E_{sig}(t,\tau) + E_{ref}(t)|^2 \\
&= |E_{sig}\exp[i\omega(t-\tau) - i\phi(t)] + E_{ref}\exp[i(\omega + \Delta\omega)t]|^2 \\
&= |E_{sig}|^2 + |E_{ref}|^2 + 2|E_{sig}E_{ref}|\cos[\Delta\omega t + \omega\tau + \phi(t)].
\end{aligned} \qquad (EQ.\ 5)$$

From Eq (5), it is apparent that the detector voltage consists of a DC background $|E_{sig}|^2 + |E_{ref}|^2$ modulated at the difference frequency $\Delta\omega$ owing to interference between the signal and reference beams. The impact of the relative path delay $\tau$ between signal and reference is simply to add a constant—i.e, ignorable—phase shift $\omega\tau$ to this interference term. The OHD beat signal 35 is squared up by passing through a saturated amplifier and is then compared with a similar clock waveform derived from the electrical oscillator 36 to the OFS 28. The time delay—or phase difference—between the edges of these two waveforms corresponds to the optical phase difference $\phi(\tau)$ between the signal and reference beams. This error signal is then fed back to a respective PA 72 located in the low power front end of the corresponding amplifier chain to control its phase to within a multiple of $2\pi$. In this manner, each beamlet is locked independently to the same phase as the reference beam and thus indirectly to one another.

Since no real laser system is purely monochromatic, a more realistic description that is valid for broad-bandwidth lasers requires a modification to Eq (1):

$$E_{MO}(t) = E_{MO} \exp[i\omega t + i\phi_{MO}(t)], \qquad (EQ.\ 6)$$

where $\phi_{MO}(t)$ is a time-dependent optical phase term. $\phi_{MO}(t)$ can represent, for example, a controlled phase imposed by an external phase modulator, or it may alternatively represent the uncontrolled fluctuations of the instantaneous carrier frequency that typically are evident in a multi-longitudinal mode laser or frequency-broadened laser amplifier. Since this term is present on the MO beam prior to splitting, it also is present in both the signal and reference beams—i.e., it is common-mode phase noise. The analysis in the preceding section can be reproduced with the substitution of Eq (6) for the MO field of Eq (1). This yields an expression for the time- and delay-dependent OHD beat signal:

$$\begin{aligned}
V(t,\tau) &= |E_{sig}(t,\tau) + E_{ref}(t)|^2 \\
&= |E_{sig}\exp[i\omega(t-\tau) + i\phi_{MO}(t-\tau) - i\phi(t)] + \\
&\quad\ |E_{ref}\exp[i(\omega + \Delta\omega)t + i\phi_{MO}(t)]|^2 \\
&= |E_{sig}|^2 + |E_{ref}|^2 + 2|E_{sig}E_{ref}|\cos[\Delta\omega t + \omega\tau + \\
&\quad\ \phi(t) + \phi_{MO}(t) - \phi_{MO}(t-\tau)].
\end{aligned} \qquad (EQ.\ 7)$$

The key difference between Eq (7) for broadband MO and Eq (5) for a single-frequency MO is the additional phase term $\phi_{MO}(t) - \phi_{MO}(t-\tau)$.

For the general case in which the paths are not matched (i.e., τ≠0), the OHD beat signal 35 will be affected by the bandwidth of the MO 12. When the paths are matched with τ=0, this term vanishes and Eq (7) reduces to Eq (5), with system behavior identical to the case of single-frequency lasers. The goal of the path-matching control system is to use the OHD beat signal 35 of Eq (7) to provide an error signal for a feedback control system that can minimize the path delay so that τ≈0 and Eq (5) is valid. Once this has been accomplished, traditional piston phase-locking as described in the previous section can actively lock the phases of the signal and reference beams. The error signal for path-match control is derived by filtering the OHD beat signal [Eq (7)] using an electronic bandpass filter with a bandwidth 2δω centered at the frequency shift Δω. The filter bandwidth 2δω is set sufficiently large to capture the dynamics of the optical phase difference φ(t) that are of interest for the phase-locking loop, and sufficiently narrow to eliminate signal fluctuations that are much faster. The filtered OHD signal can be written in frequency space as $$V_{\delta\omega}(f,\tau)=T(\Delta\omega\pm\delta\omega)*\Im\{V(t,\tau)\} \quad (EQ. 8)$$

where $T(\Delta\omega\pm\delta\omega)$ represents a bandpass filter function that passes only frequencies within the range $\Delta\omega\pm\delta\omega$; and $\Im\{V(t,\tau)\}$ represents the Fourier transform of the OHD beat signal from Eq (7).

The electrical power of the filtered signal is proportional to $|V_{\delta\omega}(f,\tau)|^2$. When the path delay τ is nonzero, the term $\phi_{MO}(t)-\phi_{MO}(t-\tau)$ from Eq (7) will vary quickly in time, resulting in OHD signal frequencies that are blocked by the bandpass filter and thus a reduction in the power of the filtered signal. When the path delay is near-zero, then the term $\phi_{MO}(t)-\phi_{MO}(t-\tau)$ is near-constant or slowly varying in time, resulting in an OHD signal that is a nearly-pure oscillation at the difference frequency Δω [i.e., nearly equivalent to Eq (5)], thus corresponding to near-maximum power in the filtered signal. Therefore it can be seen that the power of the filtered OHD signal provides a metric of path delay τ, with a maximum power attained when τ=0.

Figure 5:
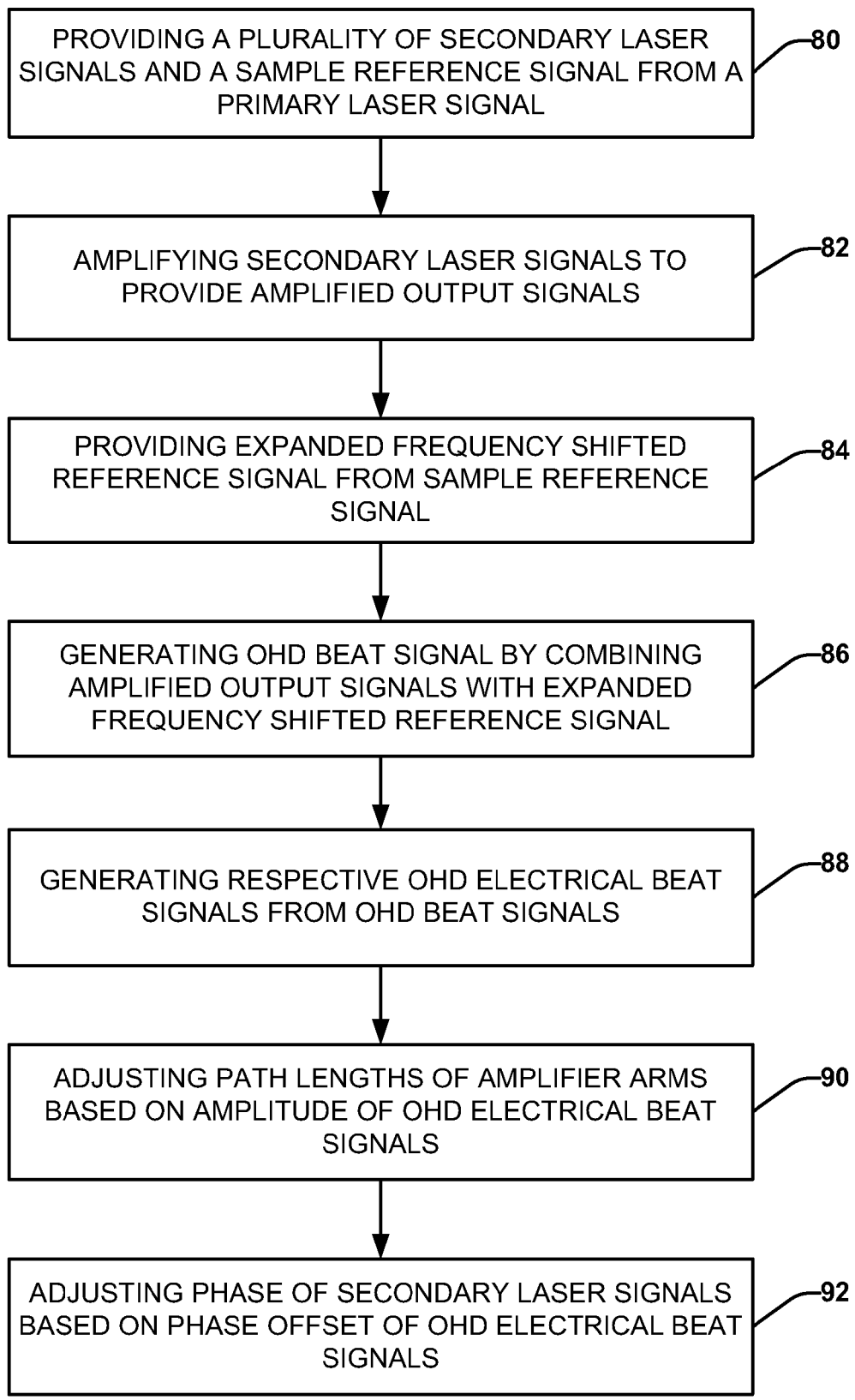
FIG. 5 illustrates a methodology for coherent beam combination in accordance with an aspect of the present invention.

In view of the foregoing structural and functional features described above, a methodology in accordance with various aspects of the present invention will be better appreciated with reference to FIG. 5. While, for purposes of simplicity of explanation, the methodologies of FIG. 5 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 5 illustrates a methodology for coherent beam combination in accordance with an aspect of the present invention. The methodology begins at 80 where a plurality of secondary laser signals and a sample reference signal are provided from a primary laser signal. At 82, the secondary laser signals are amplified along respective amplifier arms to provide a plurality of amplified output signals. At 84, the sampled reference signal is frequency-shifted with a fixed frequency electrical signal and expanded to provide an expanded frequency-shifted reference beam. At 86, a plurality of optical beat signals are generated based on combining respective amplified output signals of the plurality of amplified output signals with the expanded frequency-shifted reference beam. At 88, respective OHD beat signals are generated from the optical beat signals being provided to respective photodetectors. At 90, path lengths of respective amplifier arms are adjusted based on respective amplitudes of the plurality of OHD beat signals to control the path length of respective amplifier arms to within a coherence length of the primary laser signal. At 92, phases of secondary laser signals are adjusted based on phase offsets of the OHD beat signals relative to the fixed frequency electrical signal.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

Having described the invention, the following is claimed:

1. A laser system comprising:
    a master oscillator for generating a primary laser signal;
    a beam splitter array for splitting the primary laser signal into a sample reference signal and a plurality of secondary laser signals;
    an optical frequency shifter for shifting the frequency of the sample reference laser signal to provide a frequency-shifted reference beam;
    a beam expander for expanding the frequency-shifted reference beam to provide an expanded frequency-shifted reference beam;
    a plurality of amplifier arms that each receive a respective secondary laser signal of the plurality of secondary laser signals, each amplifier arm comprising a path length adjuster for adjusting a path length of the amplifier arm and an amplifier for amplifying the secondary laser signal to provide an amplified output signal;
    a beam sampler that interferes the light of the amplified output signal of the plurality of amplifier arms with the expanded frequency-shifted reference beam to provide a plurality of optical heterodyne detected (OHD) beat signals;
    a plurality of photodetectors that each receive a respective OHD beat signal to provide a plurality of OHD electrical beat signals, each OHD electrical beat signal having a maximum amplitude that corresponds to a minimum path length mismatch of a respective amplifier arm; and
    a path length controller responsive to the plurality of OHD electrical beat signals for providing a plurality of feedback signals to adjust the path length adjusters to control the path length of each of the plurality of amplifier arms to within a coherence length of the primary laser signal.

2. The system of claim 1, further comprising an electrical oscillator that generates a fixed frequency electrical signal, and wherein said optical frequency shifter responds to the fixed frequency electrical signal for shifting the frequency of the sample reference signal by the fixed frequency electrical signal.

3. The system of claim 1, wherein the path length controller is configured scan the actuation range of each of a given path length adjuster while monitoring the amplitude of the respective OHD electrical beat signal to determine a maximum amplitude and set an initial path length delay setpoint of the given path length adjuster.

4. The system of claim 3, wherein the path length controller is configured to set an initial path length dither range about the initial path length delay setpoint of the given path length adjuster, to measure the amplitude of a given OHD electrical beat signal at a minimum path length and maximum path length of the dither range and to reset the path length delay setpoint to the minimum path length and maximum path length of the dither range that has the greater amplitude.

5. The system of claim 1, wherein each amplifier is a fiber amplifier.

6. The system of claim 1, wherein each amplifier arm further comprises a phase adjuster for adjusting the phase of a respective one of the plurality of secondary laser signals and further comprising a phase controller for controlling the phase adjustments of each of the phase adjusters.

7. The system of claim 6, wherein each of the OHD electrical beat signals has a phase that corresponds to the phase offset of a respective amplified output signal relative to the expanded frequency-shifted reference beam, the phase controller responsive to the OHD electrical beat signals for providing a plurality of feedback signals to adjust the phase adjusters to control the phase of each of the plurality of secondary signals to within an arbitrary multiple of one wavelength of the expanded frequency-shifted reference beam.

8. The system of claim 1, wherein at least one of the path length adjusters is an actuator configured to control an optical propagation path length of the respective amplifier arm.

9. The system of claim 8, wherein the actuator is a spiral waveguide.

10. A laser system comprising:
means for providing a plurality of secondary laser signals from a primary laser signal;
a plurality of means for amplifying the plurality of secondary signals to provide a plurality of amplified output signals;
means for providing a frequency-shifted reference beam from the primary laser signal;
means for generating a plurality of optical heterodyne detected (OHD) beat signals from the plurality of amplified output signals and the frequency-shifted reference beam;
means for generating a plurality of feedback signals from the plurality of OHD beat signals;
a plurality of means for adjusting a path length associated with respective means for amplifying for each of the plurality of means for amplifying; and
means for controlling the plurality of means for adjusting a path length based on respective amplitudes of the plurality of OHD beat signals to control the path length of each of the plurality of means for amplifying to within a coherence length of the primary laser signal.

11. The system of claim 10, wherein the means for providing a frequency-shifted reference beam from the primary laser signal comprises:
means for generating a fixed frequency electrical signal;
means for frequency shifting the primary laser signal by the fixed frequency electrical signal to provide a frequency-shifted reference beam; and
means for expanding the frequency-shifted reference beam into an expanded fixed frequency reference beam.

12. The system of claim 10, further comprising a plurality of means for generating respective OHD electrical beat signals from respective OHD beat signals.

13. The system of claim 12, wherein the means responsive to control the plurality of means for adjusting a path length is configured to scan the range of each of a given means for adjusting a path length while monitoring the amplitude of the respective OHD electrical beat signal to determine a maximum amplitude and to set an initial path length delay setpoint of the given means for adjusting a path length.

14. The system of claim 13, wherein the means for controlling the plurality of means for adjusting a path length is configured to set an initial path length dither range about the initial path length delay setpoint of the given means for adjusting path lengths, to measure the amplitude of a given OHD electrical beat signal at a minimum path length and maximum path length of the dither range and to reset the path length delay setpoint to the minimum path length and maximum path length of the dither range that has the greater amplitude.

15. The system of claim 10, further comprising a plurality of means for adjusting the phase of the plurality of secondary signals and further comprising means for controlling the phase adjustments of each of the plurality of means for adjusting the phase of the plurality of phase adjustments based on a phase offset of a respective amplified output signal relative to the frequency-shifted reference beam.

16. A method for coherent beam combination, the method comprising:
providing a plurality of secondary laser signals from a primary laser signal;
amplifying the plurality of secondary signals along respective amplifier arms to provide a plurality of amplified output signals;
providing a frequency-shifted reference beam from the primary laser signal;
generating a plurality of optically heterodyne detected (OHD) beat signals based on combining respective amplified output signals of the plurality of amplified output signals with the frequency-shifted reference beam; and
adjusting path lengths of respective amplifier arms based on respective amplitudes of the plurality of OHD beat signals to control the path length of respective amplifier arms to within a coherence length of the primary laser signal.

17. The method of claim 16, further comprising converting the plurality of OHD beat signals into a plurality of OHD electrical beat signals.

18. The method of claim 17, wherein the adjusting path lengths comprises scanning the range of each of a given path length adjuster associated with a given amplifier arm while monitoring the amplitude of a respective OHD electrical beat signal to determine a maximum amplitude and setting an initial path length delay setpoint of the given path length adjuster based on the determined maximum amplitude.

19. The method of claim 18, wherein the adjusting path lengths further comprises setting an initial path length dither range about the initial path length delay setpoint of the given path length adjuster, measuring the amplitude of the OHD electrical beat signal at a minimum path length and maximum path length of the dither range and resetting the path length delay setpoint to the minimum path length or maximum path length of the dither range base on the path length that has the greater amplitude.

20. The method of claim 16, further comprising adjusting the phase of the plurality of secondary signals based on a phase offset of a respective amplified output signal relative to the frequency-shifted reference beam.

* * * * *